(12) United States Patent
Ishizuka et al.

(10) Patent No.: US 7,199,620 B2
(45) Date of Patent: Apr. 3, 2007

(54) SIGNAL DETECTING CIRCUIT

(75) Inventors: Yuichi Ishizuka, Kanagawa (JP); Terukazu Ishibashi, Kanagawa (JP); Toshifumi Yanagida, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 35 days.

(21) Appl. No.: 11/202,246

(22) Filed: Aug. 12, 2005

(65) Prior Publication Data
US 2006/0033535 A1  Feb. 16, 2006

(30) Foreign Application Priority Data
Aug. 13, 2004 (JP) .............. 2004-235846

(51) Int. Cl.
*H03K 5/22* (2006.01)
(52) U.S. Cl. .......................... 327/65; 327/64
(58) Field of Classification Search ............ 327/63–66, 327/307, 563; 330/258
See application file for complete search history.

(56) References Cited

U.S. PATENT DOCUMENTS 5,087,832 A * 2/1992 Matsunaga ................ 327/63

6,933,752 B2 * 8/2005 Dreps et al. ................ 327/65

FOREIGN PATENT DOCUMENTS

JP    3-55968 A    3/1991

* cited by examiner

*Primary Examiner*—Long Nguyen
(74) *Attorney, Agent, or Firm*—Sughrue Mion, PLLC

(57) ABSTRACT

A signal detecting circuit includes first and second differential amplifiers and a differential exclusive-OR circuit. The first differential amplifier is configured to amplify a differential input signal and to output first positive and inversion phase output signals. The second differential amplifier is configured to amplify the differential input signal and to output second positive and inversion phase output signals. A common mode voltage of the second positive and inversion phase signals is shifted. The differential exclusive-OR circuit is configured to compare the first positive phase output signal and the second inversion phase output signal, and the second positive phase output signal and the first inversion phase output signal, and to output an exclusive logical summation of the comparing results as a positive phase exclusive-OR output signal.

16 Claims, 8 Drawing Sheets

Fig. 3A
PRIOR ART
Sin

Fig. 3B
PRIOR ART
CMP3out

Fig. 3C
PRIOR ART
CMP5out

Fig. 3D
PRIOR ART
Sout

Sin

CMP9out

CMP10out

Sout

US 7,199,620 B2

SIGNAL DETECTING CIRCUIT

BACKGROUND OF THE INVENTION

1. Field of the Invention

The present invention relates to a signal detecting circuit for converting a differential signal into a binary signal.

2 Description of the Related Art

In recent years, a high-speed transfer is demanded in data transfer to a HDD drive or the like. Conventionally, a conventional parallel transfer method has been employed. In the conventional parallel transfer method, data are transferred in parallel by using the large number of signal lines. Therefore, when the data transfer speed is made higher, synchronization has become difficult between a large number of signal lines and has become close to its limit. For this reason, a differential serial transfer method begins to be spread to allow the high speed data transfer. In the differential serial transfer method, two transmission paths as one set are used and a data is transferred as a voltage difference between the two transmission paths. Thus, the differential serial transfer method is suitable for the higher speed transfer.

On the other hand, in association with the higher speed transfer, a detection time becomes short and the amplitude of a signal is decreased, which requires a signal detecting circuit having a higher precision. A conventional example of the signal detecting circuit in such a situation is disclosed in Japanese Laid Open Patent Application (JP-A-Heisei 3-55968).

FIG. 1 is a circuit diagram showing the configuration of the conventional example. In this conventional example, the signal detecting circuit includes comparing circuits CMP1 and CMP2, an exclusive-OR circuit EOR1, and resistances R1, R2 and R3. The resistances R1, R2 and R3 set reference voltages serving as threshold levels of the comparing circuits. At this time, the threshold level of the comparing circuit CMP2 is set to be lower than the threshold level of the comparing circuit CMP1. The comparing circuits CMP1 and CMP2 have different threshold levels, and output comparison resultant signal CMP1out and CMP2out from an input signal Sin. The exclusive-OR circuit EOR1 outputs an exclusive-OR result as a signal SIv between the comparison resultant signals CMP1out and CMP2out.

When the amplitude of the input signal Sin is sufficiently larger than the reference voltages of the comparing circuits CMP1 and CMP2, the exclusive-OR result between the signals CMP1out and CMP2out is "0". Also, when the amplitude of the input signal Sin is equal to or less than the threshold level of the comparing circuit CMP1, the output of the comparing circuit CMP1 is zero. However, the comparing circuit CMP2 detects the input signal, since having the lower threshold level than that of the comparing circuit CMP1. Thus, the exclusive-OR result between the signals CMP1out and CMP2out is "1". In this way, the amplitude of the signal can be detected from the output SIv of the exclusive-OR circuit EOR1 by the setting of the threshold levels of the comparing circuits CMP1 and CMP2.

FIG. 2 shows a circuit diagram of a second conventional example where the input signal of the above-mentioned conventional example is replaced by the differential input signal.

This conventional circuit includes differential comparing circuit CMP3, CMP4, CMP5 and CMP6, and a differential exclusive-OR circuit EOR2. The differential comparing circuit CMP3 includes resistances R5 and R6, N-channel transistors Mn1 and Mn2 and a constant current source Ib3.

The differential comparing circuit CMP3 receives a differential input signal Sin of a positive phase input signal SinP and an inversion phase input signal SinN, and outputs differential resultant signals CMP3outP and CMP3outN. The differential comparing circuit CMP4 includes N-channel transistors Mn3 and Mn4 and a constant current source Ib4. The differential comparing circuit CMP4 gives an offset voltage to the differential comparing circuit CMP3. The differential comparing circuit CMP5 includes resistances R7 and R8, N-channel transistors Mn5 and Mn6 and a constant current source Ib5. The differential comparing circuit CMP5 receives the differential input signal Sin of the positive phase input signal SinP and the inversion phase input signal SinN, and outputs differential resultant signals CMP5outP and CMP5outN. The differential comparing circuit CMP6 includes N-channel transistors Mn7 and Mn8 and a constant current source Ib6. The differential comparing circuit CMP6 gives the offset voltage to the differential comparing circuit CMP5. The differential exclusive-OR circuit EOR2 connected to the outputs of the differential comparing circuit CMP3 and CMP5, and a constant current source Ib2, a resistance R4 and a reference voltage V1 set an offset voltage (=R4H−R4L).

Next, an operation of the second conventional example will be described below by using the operation waveforms shown in FIGS. 3A to 3D. When the amplitudes of the positive phase input signal SinP and inversion phase input signal SinN are small, the positive phase output signal CMP3outP from the differential comparing circuit CMP3 is a signal where an offset is given to the positive phase input signal SinP based on a reference voltage R4L supplied to the differential comparing circuit CMP4, as shown in FIG. 3B. The inversion phase output signal CMP3outN from the differential comparing circuit CMP3 is a signal where an offset is given to the inversion phase input signal SinN based on a reference voltage level R4H supplied to the differential comparing circuit CMP4, as shown in FIG. 3B. These reference voltages R4H and R4L have the offset voltage determined based on the constant current source Ib2 and the resistance R4. Similarly, the positive phase output signal CMP5outP from the differential comparing circuit CMP5 is a signal where an offset is given to the positive phase input signal SinP based on the reference voltage R4H supplied to the differential comparing circuit CMP6, as shown in FIG. 3C. The inversion phase output signal CMP5outN from the differential comparing circuit CMP5 is a signal where an offset is given to the inversion phase input signal SinN based on the reference voltage level R4L supplied to the differential comparing circuit CMP6, as shown in FIG. 3C. In the differential exclusive-OR circuit EOR2, the signals CMP3outP and CMP3outN are compared, and the signals CMP3outP and CMP3outN indicate "1" when the signal CMP3outP is equal to or larger than the first signal CMP3outN, and the signals CMP3outP and MP3outN indicate "0" when the signal CMP3outP is smaller than the signal CMP3outN. Also, the signals CMP5outN and CMP5outP are compared, and the signals CMP5outN and CMP5outP indicate "0" when the signal CMP5outN is equal to or larger than the signal CMP5outP and the signals CMP5outN and CMP5outP indicate "1" when the signal CMP5outN is smaller than the signal CMP5outP. The signal SoutP is outputted as an exclusive-OR result between the first and second signals. The signal SoutN is outputted as an inverted signal of the signal SoutP.

On the other hand, when the amplitudes of the positive phase input signal SinP and inversion phase input signal SinN are large, the signal CMP3outN becomes equal to or larger than the signal CMP3outP at a clock cycle, as shown in FIG. 3B. At this time, the signals CMP3outP and CMP3outN indicate "0". Also, the signal CMP5outP becomes equal to or larger than the signal CMP5outP at a clock cycle, as shown in FIG. 3c. At this time, the signals CMP5outN and CMP5outP indicate "1".

As a result, the signal SoutP is in the high level when the amplitudes of the signals SinP and SinN are small and is in the low level when the amplitudes of the signals SinP and SinN are large. Thus, the fact that the differential input signal Sin is supplied is detected.

By the way, in order to design the signal detecting circuit having a higher precision, it is necessary to consider the manufacturing deviation of resistances, capacitors and transistors of the circuit. In order to reduce the influence of the manufacturing deviation, there are a method of enlarging the size of the transistor, and a method of adding a circuit for correcting the manufacturing deviations. However, the increase in a layout area or the increase in a current consumption is caused even in both of the methods. In addition, the increase in the size of the transistor and the addition of the manufacturing deviation correcting circuit bring about the increase in the wiring capacitance and gate capacitance and also hinder the correspondence to a higher speed signal.

In case of the second conventional example, the constant current source Ib2 and the resistance R4 receive the influence of the manufacturing deviation. An error and parasitic capacitance of the differential comparing circuits CMP4 and CMP5 due to the manufacturing deviation hinder the precision improvement and the speed improvement.

SUMMARY OF THE INVENTION

In an aspect of the present invention, a signal detecting circuit includes first and second differential amplifiers and a differential exclusive-OR circuit. The first differential amplifier is configured to amplify a differential input signal and to output first positive and inversion phase output signals. The second differential amplifier is configured to amplify the differential input signal and to output second positive and inversion phase output signals. A common mode voltage of the second positive and inversion phase output signals are shifted by a predetermined value with respect to that of the first positive and inversion phase output signals. The differential exclusive-OR circuit is configured to output an exclusive logical summation of a first pair of differential signals of the first positive phase output signal and the second inversion phase output signal and a second pair of differential signals of the second positive phase output signal and the first inversion phase output signal, as a positive phase exclusive-OR output signal.

Here, the differential exclusive-OR circuit outputs an inversion phase exclusive-OR output signal with an inverted phase of the positive phase exclusive-OR output signal, in addition to the positive phase exclusive-OR output signal.

Also, the common mode voltage is shifted to down a reference level of the second positive and inversion phase output signals lower than that of the first positive and inversion phase output signals. In his case, the first differential amplifier may include a differential pair first and second transistors; a first resistance connected between a power supply line and the first transistor; a second resistance connected between the power supply line and the second transistor; and a first constant current source connected with the first and second transistors and a ground potential. The second differential amplifier may include a differential pair third and fourth transistors; a third resistance connected with the third transistor; a fourth resistance connected with the fourth transistor; a fifth resistance connected between the power supply line and the third and fourth resistances; and a second constant current source connected with the third and fourth transistors and the ground potential.

The common mode voltage is shifted by the fifth resistance and second constant current source. The first to fourth transistors may be N-channel MOS transistors. Also, values of the first to fourth resistances are preferably equal to each other and current values of the first and second constant current source are preferably equal to each other.

Also, the common mode voltage is shifted to raise a level of the second positive and inversion phase output signals higher than that of the first positive and inversion phase output signals. In this case, the first differential amplifier may include a differential pair first and second transistors; a first resistance connected between a ground potential and the first transistor; a second resistance connected between the ground potential and the second transistor; and a first constant current source connected with the first and second transistors and a power supply line. The second differential amplifier may include a differential pair third and fourth transistors; a third resistance connected with the third transistor; a fourth resistance connected with the fourth transistor; a fifth resistance connected between the ground potential and the third and fourth resistances; and a second constant current source connected with the third and fourth transistors and the power supply line. The common mode voltage is shifted by the fifth resistance and second constant current source.

The first to fourth transistors are P-channel MOS transistors. Also, values of the first to fourth resistances are preferably equal to each other and current values of the first and second constant current source are preferably equal to each other.

Also, the common mode voltage is shifted such that a predetermined binary logical value is outputted as the positive phase exclusive-OR output signal when an amplitude of the differential input signal is smaller than the predetermined value and such that a binary logical value different from the predetermined binary logical value is outputted as the positive phase exclusive-OR output signal when the amplitude of the differential input signal is larger than the predetermined value.

In another aspect of the present invention, a signal detecting circuit includes first and second differential amplifiers and differential exclusive-OR circuit. The first differential amplifier is configured to amplify a differential input signal and to output first positive and inversion phase output signals. The second differential amplifier is configured to amplify the differential input signal and to output second positive and inversion phase output signals. A common mode voltage of the second positive and inversion phase output signals is shifted by a predetermined value with respect to that of the first positive and inversion phase output signals. The differential exclusive-OR circuit configured to output a predetermined binary logical value as a positive phase exclusive-OR output signal when an amplitude of the differential input signal is smaller than the predetermined value and a binary logical value different from the predetermined binary logical value as the positive phase exclusive-OR output signal when the amplitude of the differential input signal is larger than the predetermined value.

Here, the differential exclusive-OR circuit outputs an inversion phase exclusive-OR output signal with an inverted phase of the positive phase exclusive-OR output signal, in addition to the positive phase exclusive-OR output signal.

Also, the differential exclusive-OR circuit compares the first positive phase output signal and the second inversion phase output signal and the second positive phase output signal and the first inversion phase output signal, and to output an exclusive logical summation of the comparing results as a positive phase exclusive-OR output signal.

Also, the common mode voltage is shifted to down a level of the second positive and inversion phase output signals lower than that of the first positive and inversion phase output signals. Instead, the common mode voltage may be shifted to raise a level of the second positive and inversion phase output signals higher than that of the first positive and inversion phase output signals.

BRIEF DESCRIPTION OF THE DRAWINGS

Figures 3A, 3B, 3C, 3D:
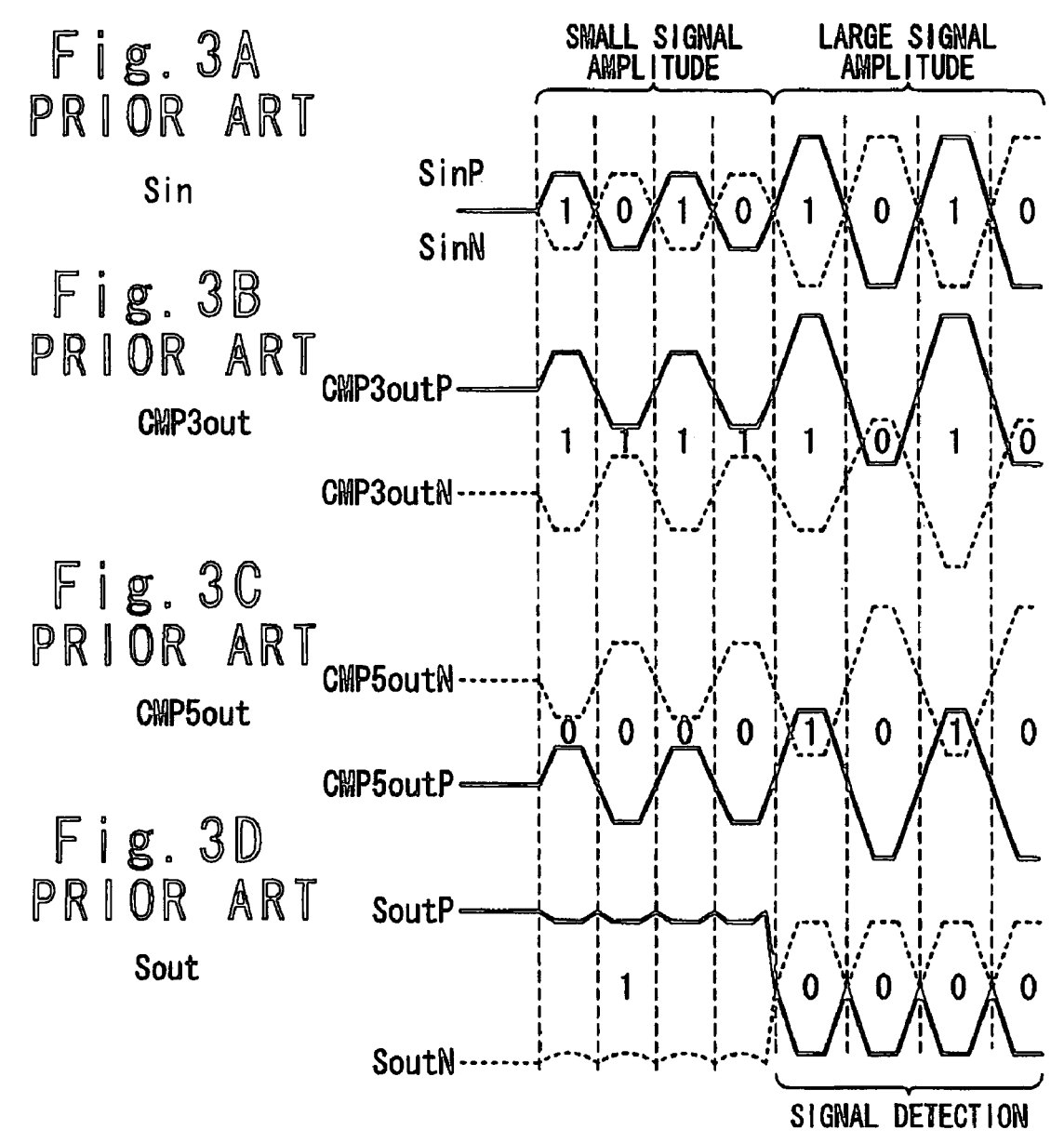

FIGS. 3A to 3D are waveforms indicating an operation of the signal detecting circuit of the second conventional example shown in FIG. 2;

DESCRIPTION OF THE PREFERRED EMBODIMENTS

Hereinafter, a signal detecting circuit according to the present invention will be described in detail with reference to the attached drawings.

[First Embodiment]

Figure 4:
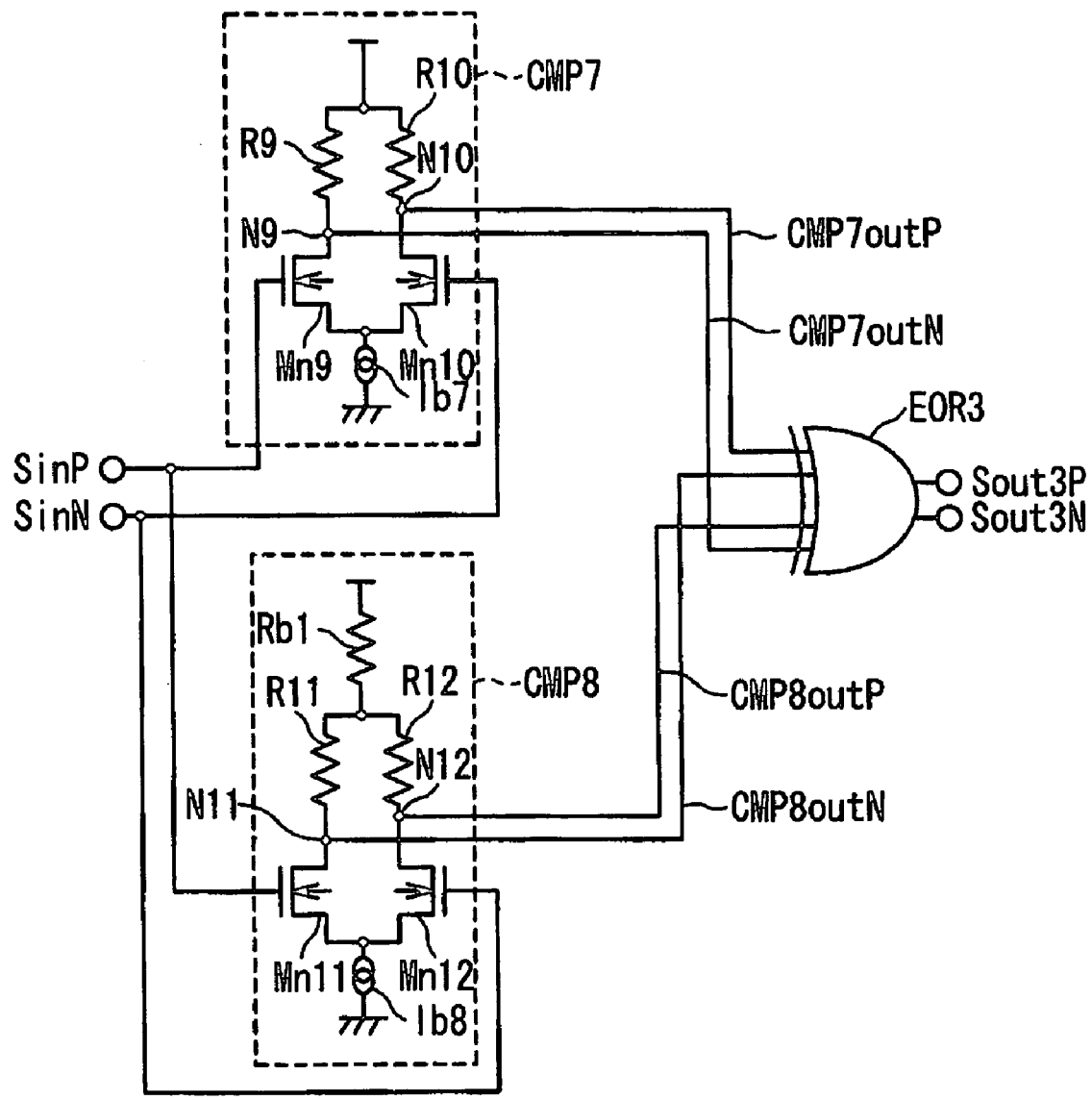
FIG. 4 is circuit diagram showing a configuration of a signal detecting circuit according to a first embodiment of the present invention.

FIG. 4 is a circuit diagram showing a configuration of the signal detecting circuit in the first embodiment. The signal detecting circuit in the first embodiment detects an amplitude of a differential input signal Sin composed of a positive phase input signal SinP and an inversion phase input signal SinN and converts it into a binary signal of signals Sout3P and Sout3N. The signal detecting circuit in the first embodiment includes differential amplifying circuits CMP7 and CMP8 and a differential exclusive-OR circuit EOR3 connected to the respective output terminals of them.

The differential amplifying circuit CMP7 includes resistances R9 and R10, N-channel transistors Mn9 and Mn10 as a differential transistor pair, and a constant current source Ib7. Respective sources of the N-channel transistors Mn9 and Mn10 are commonly connected to one end of a constant current source Ib7, and the other end of the constant current source Ib7 is grounded. A drain of the N-channel transistor Mn9 is connected through a node N9 to one end of the resistance R9, and a drain of the N-channel transistor Mn10 is connected through a node N10 to one end of the resistance R10. The other ends of the resistances R9 and R10 are commonly connected to a power supply line. The positive phase input signal SinP is supplied to a gate of the N-channel transistor Mn9, and the inversion phase input signal SinN is supplied to a gate of the N-channel transistor Mn10, respectively. An inversion phase output signal CMP7outN is outputted from the node N9, and a positive phase output signal CMP7outP is outputted from the node N10.

The differential amplifying circuit CMP8 includes resistances R11 and R12, N-channel transistors Mn11 and Mn12 as a differential transistor pair, a constant current source Ib8 and a resistance Rb1 for giving a common mode voltage to an output signal. Respective sources of the N-channel transistors Mn11 and Mn12 are commonly connected to one end of the constant current source Ib8, and the other end of the constant current source Ib8 is grounded. A drain of the N-channel transistor Mn11 is connected through a node N11 to one end of the resistance R11, and a drain of the N-channel transistor Mn12 is connected through a node N12 to one end of the resistance R12. The other ends of the resistances R11 and R12 are commonly connected to one end of the resistance Rb1. The other end of the resistance Rb1 is connected to the power supply line. The positive phase input signal SinP is supplied to a gate of the N-channel transistor Mn11, and the inversion phase input signal SinN is supplied to a gate of the N-channel transistor Mn12, respectively. An inversion phase output signal CMP8outN is outputted from the node N11, and a positive phase output signal CMP8outP is outputted from the node N12. At this time, the resistance Rb1 shifts the common mode voltage of the positive phase output signal CMP8outP and the inversion phase output signal CMP8outN by Voff1.

The differential exclusive-OR circuit EOR3 is connected to the nodes N9, N10, N11 and N12. The differential exclusive-OR circuit EOR3 receives the positive phase output signal CMP7outP and the inversion phase output signal CMP8outN as a pair and the positive phase output signal CMP8outP and the inversion phase output signal CMP7outN as another pair. The differential exclusive-OR circuit EOR3 compares a signal pair of the positive phase output signal CMP7outP and the inversion phase output signal CMP8outN and a signal pair of the positive phase output signal CMP8outP and the inversion phase output signal CMP7outN. Thus, the differential exclusive-OR circuit EOR3 outputs binary signals Sout3P and Sout3N based on the comparing results.

Figure 8:
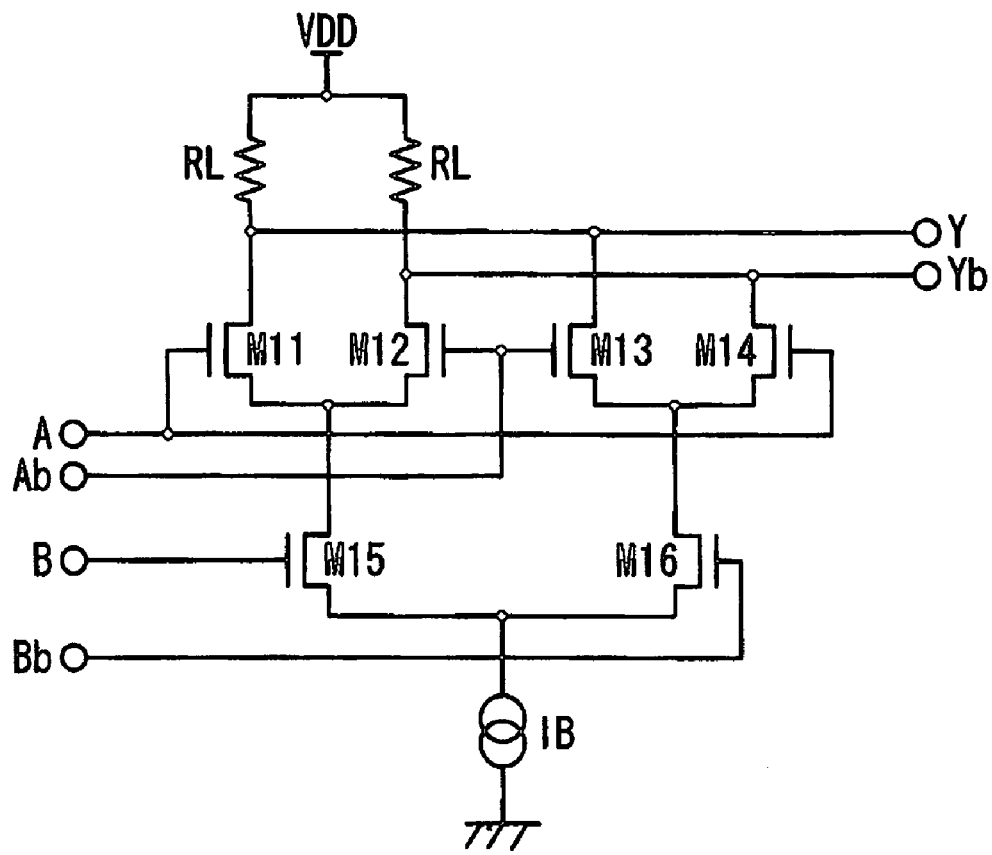
FIG. 8 is a circuit diagram showing a configuration of a differential exclusive-OR circuit; and, FIGS. 9A to 9C are timing charts showing an operation of the differential exclusive-OR circuit.
Figure 9A:
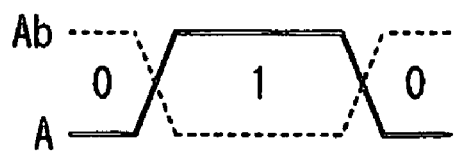
Figure 9B:
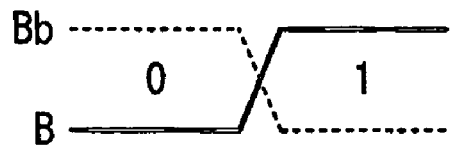
Figure 9C:

The detailed circuit configuration of the differential exclusive-OR circuit EOR3 is shown in FIG. 8, and the operation of it is shown in FIGS. 9A to 9C. The differential exclusive-OR circuit EOR3 could be understood to a person skilled in the art from these figures.

Figure 5:
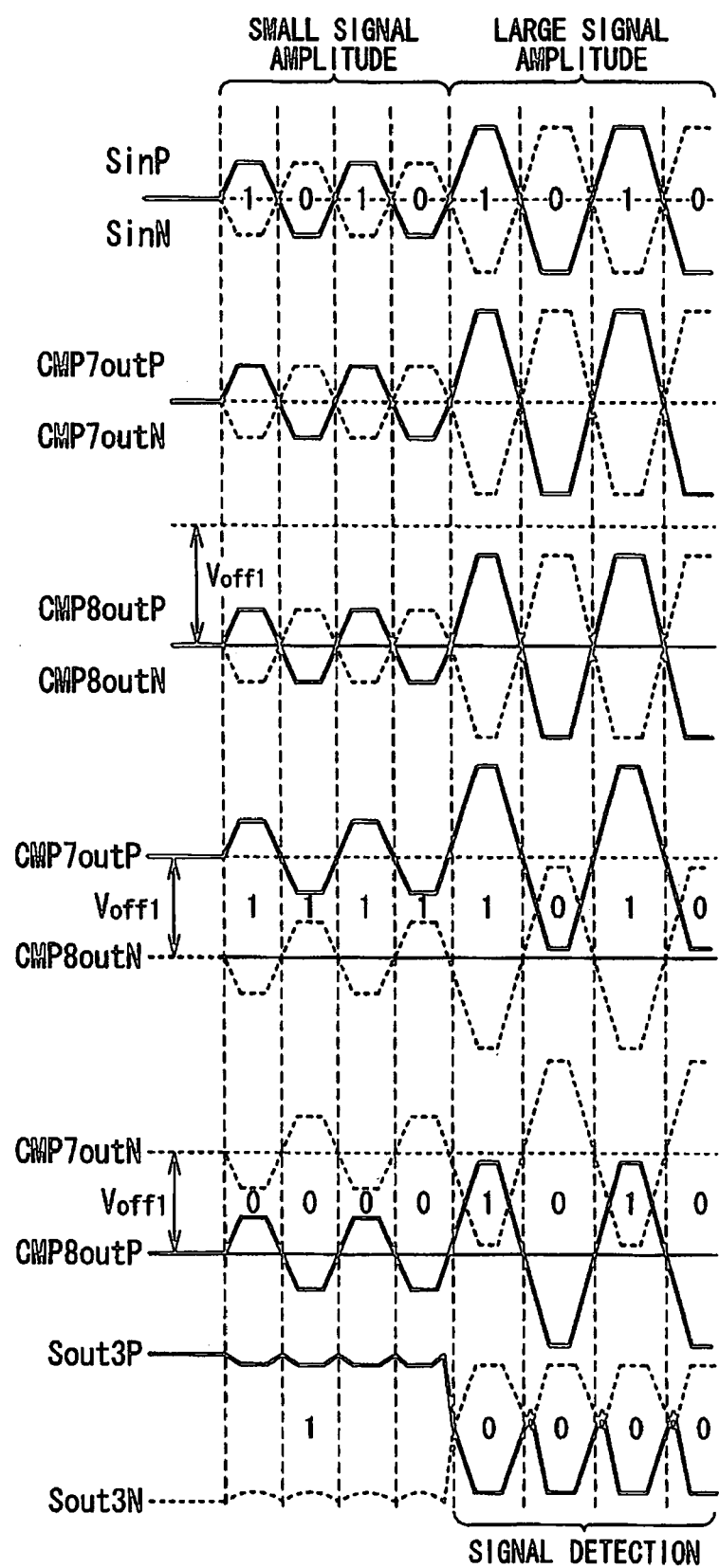
FIGS. 5A to 5F are waveforms indicating an operation of the signal detecting circuit according to the first embodiment of the present invention.

Next, an operation of the signal detecting circuit in the first embodiment will be described below with reference to FIGS. 5A to 5F. A differential input signal Sin of the positive phase input signal SinP and the inversion phase input signal SinN is supplied to the signal detecting circuit. As shown in FIG. 5A, the positive phase input signal SinP and the inversion phase input signal SinN have the same DC operation voltage level, the phases opposite to each other and the same amplitude.

The differential amplifying circuit CMP7 amplifies the differential input signal Sin and outputs the differential output signal CMP7out of the positive phase output signal CMP7outP and the inversion phase output signal CMP7outN. At this time, the inversion phase output signal CMP7outN is outputted from the node N9, and the positive phase output signal CMP7outP is outputted from the node N10, as shown in FIG. 5B. Similarly, the differential amplifying circuit CMP8 amplifies the differential input signal Sin and outputs a differential output signal CMP8out of the positive phase output signal CMP8outP and the inversion phase output signal CMP8outN. At this time, the inversion phase output signal CMP8outN is outputted from the node N11, and the positive phase output signal CMP8outP is outputted from the node N12 as shown in FIG. 5C. In addition, the common mode voltage of the signals CMP8outP and CMPoutN is shifted by Voff1 generated by the resistance Rb1 and constant current source Ib8. That is, the differential output signal CMP8out has a DC operation voltage level lower than that of the differential output signal CMP7out. The amplitudes of the respective differential output signals are equal to each other under the conditions of Ib7=Ib8 and R9=R10=R11=R12.

As shown in FIG. 5D, the differential exclusive-OR EOR3 compares the positive phase output signal CMP7outP and the negative phase output signal CMP8outN to which the offset voltage Voff1 is applied. When the positive phase output signal CMP7outP is higher than the inversion phase output signal CMP8outN, the signals CMP7outP and CMP8outN indicate "1". Also, the positive phase output signal CMP7outP is equal to or lower than the inversion phase output signal CMP8outN, the signals CMP7outP and CMP8outN indicate "0". Similarly, as shown in FIG. 5E, the differential exclusive-OR EOR3 compares the inversion phase output signal CMP7outN and the positive phase output signal CMP8outP to which the offset voltage Voff1 is applied. When the inversion phase output signal CMP7outN is higher than the positive phase output signal CMP8outP, the signals CMP7outN and CMP8outP indicate "0". Also, the inversion phase output signal CMP7outP is equal to or lower than the positive phase output signal CMP8outN, the signals CMP7outN and CMP8outP indicate "1". Then, the differential exclusive-OR EOR3 calculates the exclusive-OR between the signal pair of the signals CMP7outP and CMP8outN and the signal pair of the signals CMP7outN and CMP8outP, and output the signals Sout3P and Sout3N. The signal Sout3N has a waveform obtained by inverting the signal Sout3P.

The resistance Rb1 of a common mode voltage adjusting circuit is predetermined based on the amplitude of a signal to be detected. If the amplitudes of the positive phase input signal SinP and the inversion phase input signal SinN are smaller than the amplitude of the signal to be detected, the resistance Rb1 is determined to give the shift value Voff1 of the common mode voltage such that the inversion phase output signal CMP8outN is always lower than the positive phase output signal CMP7outP, and the positive phase output signal CMP8outP is always lower than the inversion phase output signal CMP7outN. In addition, the resistance Rb1 is determined as follows. That is, when the amplitudes of the positive phase input signal SinP and the inversion phase input signal SinN are higher than that of the signal to be detected, the positive phase output signal CMP7outP is higher than the inversion phase output signal CMP8outN when the positive phase input signal SinP is higher than the inversion phase input signal SinN, and the inversion phase output signal CMP7outN is higher than the positive phase output signal CMP8outP when the positive phase input signal SinP is lower than the inversion phase input signal SinN.

When the differential input signal Sin having the amplitude equal to or higher than the shift value Voff1 of the common mode voltage set based on the resistance Rb1 is supplied, the binary signals Sout3P and Sout3N are "0" and "1", and the differential input signal Sin can be detected.

Here, a direct current voltage error that causes a signal detection error of the signal detecting circuit will be described through comparison of the signal detecting circuit of the second conventional example and the signal detecting circuit according to the present invention.

Figure 1:
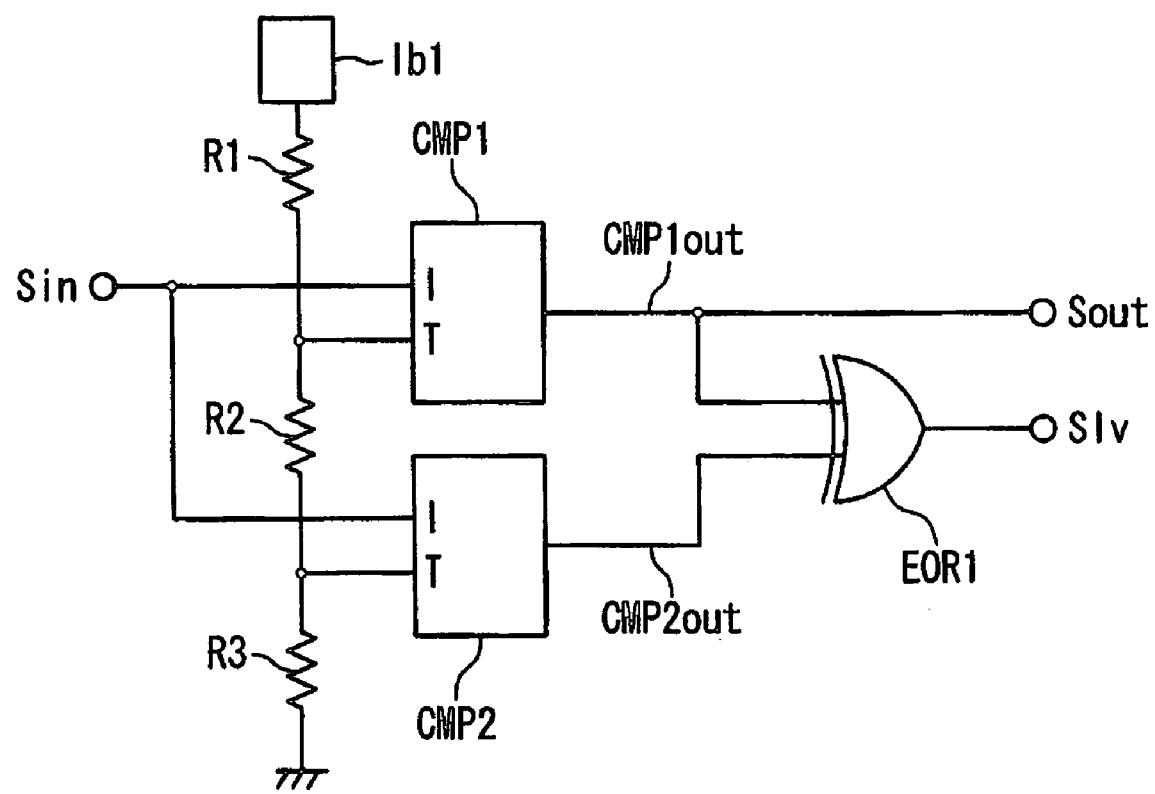
FIG. 1 is a block diagram showing a configuration of a signal detecting circuit of a first conventional example.
Figure 2:
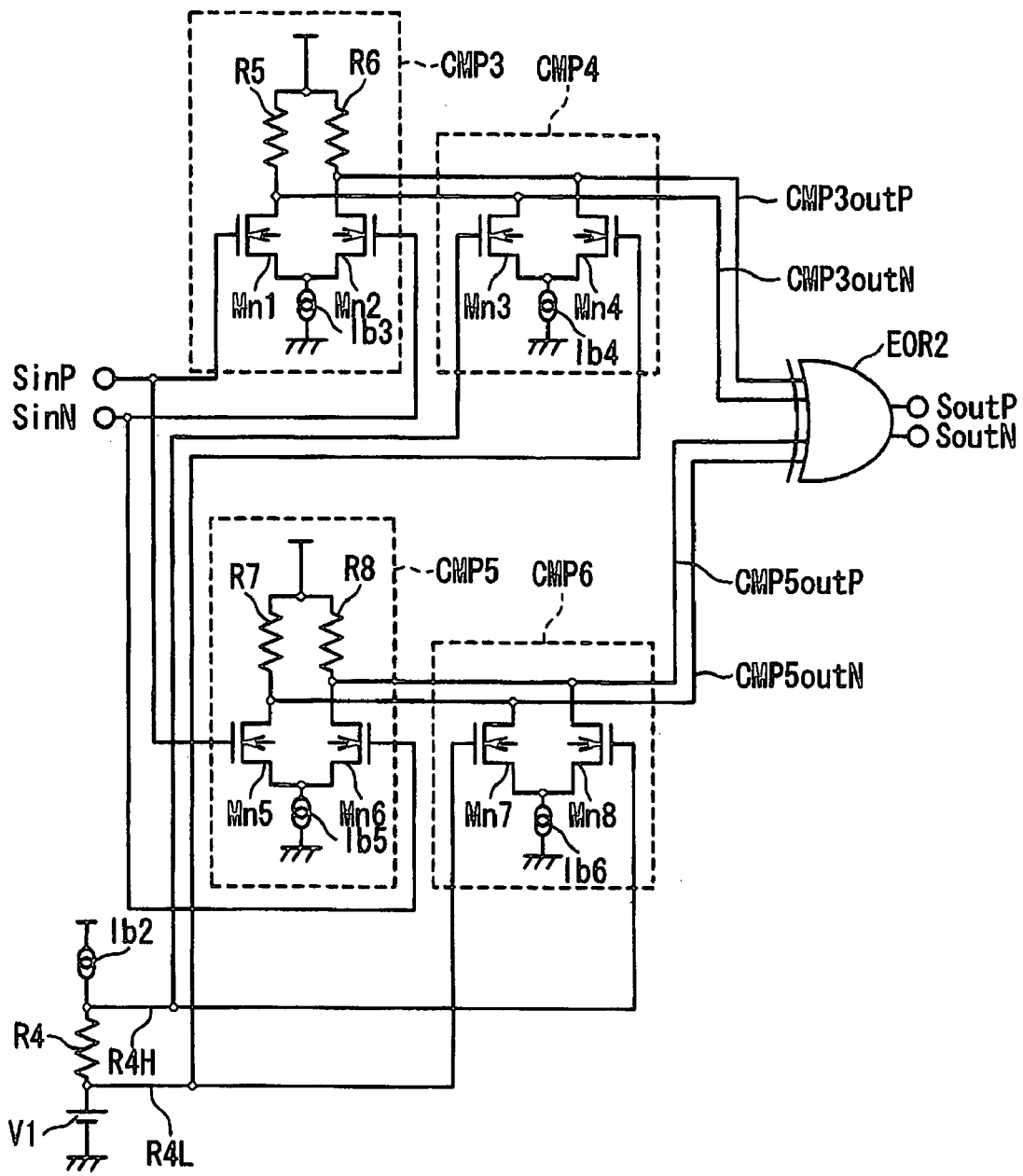
FIG. 2 is a block diagram showing a configuration of a signal detecting circuit of a second conventional example for a differential signal of the conventional signal.

In the second conventional example shown in FIG. 2, when $\Delta Vsin$ denotes a direct current voltage error of an input signal Sin, $\Delta Vref2$ denotes an error of a reference voltage across both ends of the resistance R4, $\Delta Vin3$ denotes an input conversion direct current voltage error in the differential amplifying circuits CMP3 and CMP7, $\Delta Vin4$ denotes an input conversion direct current voltage error in the differential amplifying circuit CMP4, $\Delta Vin5$ denotes an input conversion direct current voltage error in the differential amplifying circuits CMP5 and CMP8, $\Delta Vin6$ denotes an input conversion direct current voltage error in the differential amplifying circuit CMP6, and AvCMP denotes a voltage amplification factor of the differential amplifying circuit, a total summation Voffset1 of the direct current voltage errors in the differential output signal is given by the following equation.

$$Voffset1 = (\Delta Vsin + \Delta Vin3) * AvCMP + (\Delta Vref2 + Vin4) * \qquad (1)$$
$$AvCMP + (\Delta Vsin + \Delta Vin5) * AvCMP + AvCMP +$$
$$(\Delta Vref2 + Vin6) * AvCMP$$

Since the $\Delta Vsin$ can be regarded as 0 because of the differential input, the equation (1) is represented by:

$$Voffset1 = \Delta Vin3 * ACMP + (\Delta Vref2 + Vin4) * AvCMP + \qquad (2)$$
$$\Delta Vin5 * AvCMP + (\Delta Vref2 + Vin6) * AvCMP$$

On the other hand, in case of the first embodiment of the present invention, in FIG. 4, when $\Delta vref$ is an error of the voltage generated by the resistance Rb1 and the constant current source Ib8 in the common mode voltage adjusting circuit, a total summation Voffset2 of the direct current voltage errors in the differential exchange output signal is represented by:

$$Voffset2 = (\Delta Vsin + \Delta Vin3) * AvCMP + \qquad (3)$$
$$(\Delta Vsin + \Delta Vin5) * AvCMP + \Delta Vref$$

Since the $\Delta Vsin$ can be regarded as 0 because of the differential input, the equation (3) is represented by:

$$Voffset2 = (\Delta Vin3) * AvCMP + (\Delta Vin5) * AvCMP + \Delta Vref \qquad (4)$$

The differential amplifying circuit CMP8 has a function of the generation of the offset voltage in the second conventional example. From the equations (2) and (4), the difference between the total summations of the direct current voltage errors in the differential output signal of the second conventional example and that in the present invention is represented by:

$$Voffset1 - Voffset2 = ((\Delta Vref2 + \Delta Vin4) +$$

$$(\Delta Vref2 + \Delta Vin6)) * AvCMP - \Delta Vref$$

Thus, the direct current voltage error which causes the signal detection error in the signal detecting circuit is reduced.

Also, since the circuit is simplified over the conventional example, the layout area of the circuit can be reduced, thereby dropping the electric power consumption. Thus, the circuit in the present invention can be produced at a cheaper cost. Moreover, since the capacitive load is reduced, the frequency property is improved over the second conventional example.

As mentioned above, the offset voltage control is not applied to both of the two differential amplifying circuits, and the common mode voltage control is applied to one of them. Thus, the reference voltage circuit can be reduced, thereby decreasing the error factors caused based on the manufacturing deviation of the differential amplifying circuit. Therefore, it is possible to attain the signal detection having the higher precision.

[Second Embodiment]

Next, the signal detecting circuit according to the second embodiment of the present invention will be described below with reference to FIGS. 6 and FIGS. 7A to 7F.

Figure 6:
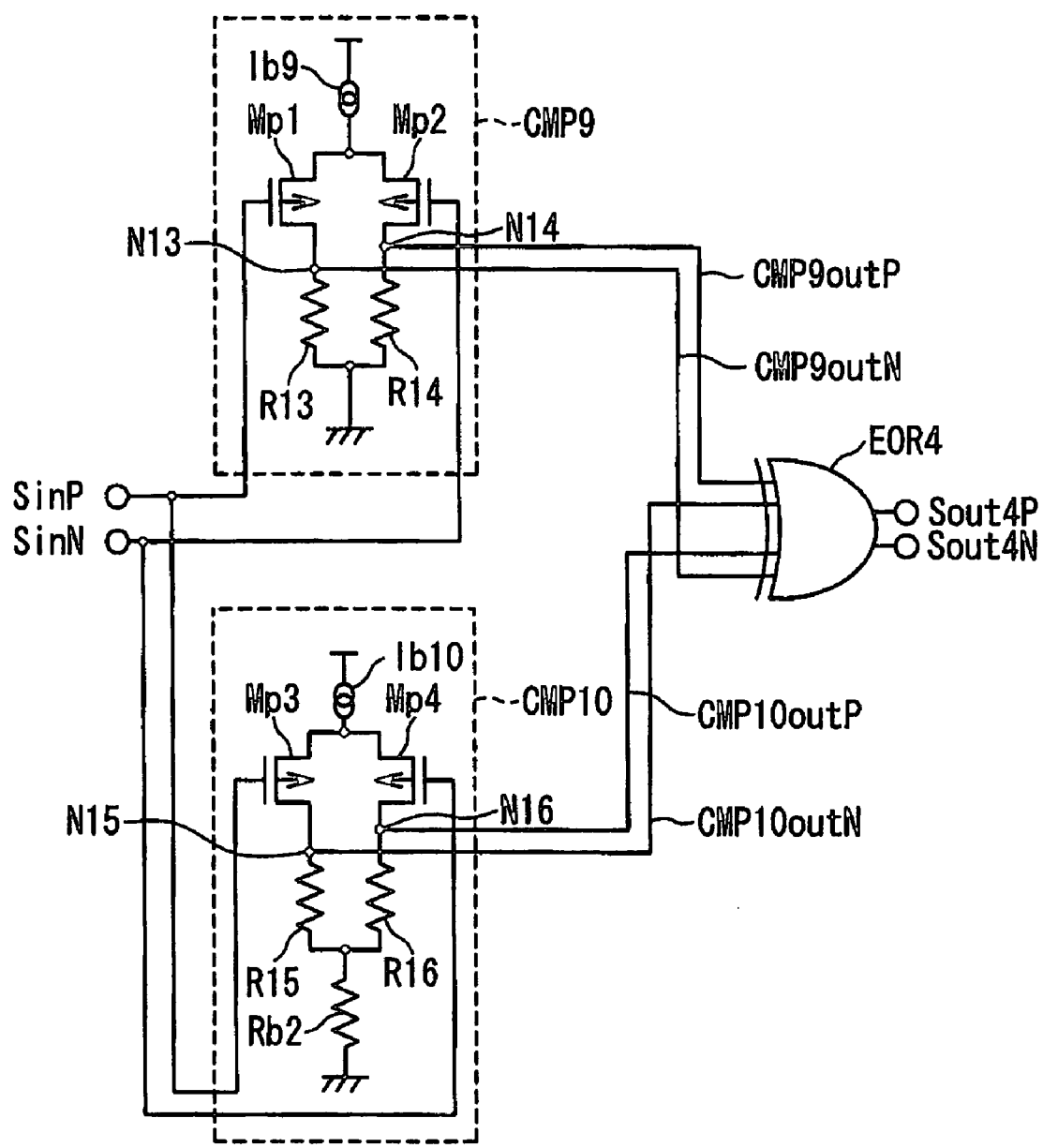
FIG. 6 is circuit diagram showing a configuration of the signal detecting circuit according to a second embodiment of the present invention.

FIG. 6 is a circuit diagram showing a configuration of the signal detecting circuit according to the second embodiment of the present invention. The signal detecting circuit in the second embodiment includes differential amplifying circuits CMP9 and CMP10 and a differential exclusive-OR circuit EOR4 connected to the respective output terminals. The differential amplifying circuit CMP9 has resistances R13 and R14, P-channel transistors Mp1 and Mp2 and a constant current source Ib9. Respective sources of the P-channel transistors Mp1 and Mp2 are commonly connected to one end of the constant current source Ib9, and the other end of the constant current source Ib9 is connected to the power supply line. A drain of the P-channel transistor Mp1 is connected through a node N13 to one end of the resistance R13, and a drain of the P-channel transistor Mp2 is connected through a node N14 to one end of the resistance R14. The other ends of the resistances R13 and R14 are commonly connected and grounded. The positive phase input signal SinP is supplied to a gate of the P-channel transistor Mp1, and the inversion phase input signal SinN is supplied to a gate of the P-channel transistor Mp2, respectively. An inversion phase output signal CMP9outN is outputted from the node N13, and a positive phase output signal CMP9outP is outputted from the node N14.

The differential amplifying circuit CMP10 includes resistances R15 and R16, P-channel transistors Mp3 and Mp4 as a differential transistor pair, a constant current source Ib10 and a resistance Rb2 for giving a common mode voltage shift value voff2 to the output signal. Respective sources of the P-channel transistors Mp3, Mp4 are commonly connected to one end of the constant current source Ib10, and the other end of the constant current source Ib10 is connected to the power supply line. A drain of the P-channel transistor Mp3 is connected through a node N15 to one end of the resistance R15, and a drain of the P-channel transistor Mp4 is connected through a node N16 to one end of the resistance R16. The other ends of the resistances R15 and R16 are commonly connected to one end of the resistance Rb2 and the other end of the resistance Rb2 is grounded. The positive phase input signal SinP is supplied to a gate of the P-channel transistor Mp3, and the inversion phase input signal SinN is supplied to a gate of the P-channel transistor Mp4, respectively. An inversion phase output signal CMP10outN is outputted from the node N15, and a positive phase output signal CMP10outP is outputted from the node N16. At this time, the resistance Rb2 gives the common mode voltage shift value Voff2 to the positive phase output signal CMP10outP and the inversion phase output signal CMP10outN.

The differential exclusive-OR circuit EOR4 is connected to the nodes N13, N14, N15 and N16. The differential exclusive-OR circuit EOR4 has the same circuit configuration as the differential exclusive-OR circuit EOR3. The differential exclusive-OR circuit EOR4 receives a positive phase output signal CMP9outP, an inversion phase output signal CMP10outN, a positive phase output signal CMP10outP and an inversion phase output signal CMP9outN. The differential exclusive-OR circuit EOR4 compares the positive phase output signal CMP9outP and the inversion phase output signal CMP10outN, and the positive phase output signal CMP10outP and the inversion phase output signal CMP9outN, and calculates an exclusive-OR between the comparing results to output a signal Sout of binary signals Sout4P and Sout4N.

Figure 7A:
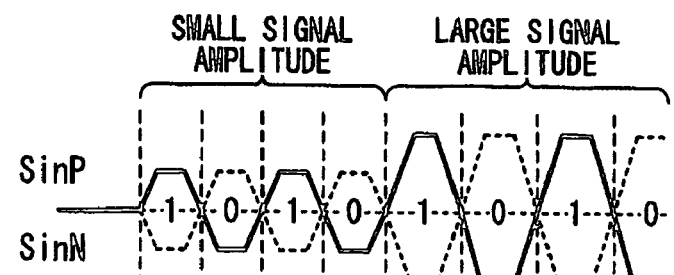
FIGS. 7A to 7F are waveforms indicating an operation of the signal detecting circuit according to the second embodiment of the present invention.

Next, an operation of the signal detecting circuit in the second embodiment of the present invention will be described below with reference to FIGS. 7A to 7F. A differential input signal Sin as a signal to be detected is composed of the positive phase input signal SinP and the inversion phase input signal SinN. As shown in FIG. 7A, the positive phase input signal SinP and the inversion phase input signal SinN have the same DC operation voltage level, the phases opposite to each other and the same amplitude.

Figure 7B:
Figure 7C:
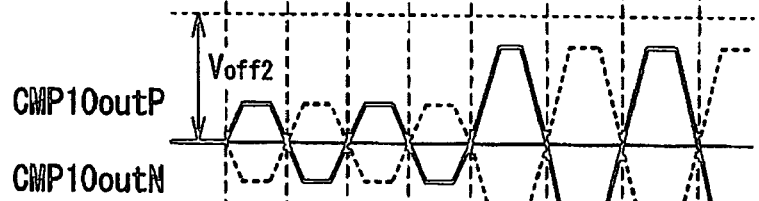

The differential amplifying circuit CMP9 amplifies the differential input signal Sin and outputs a differential output signal CMP9out composed of the positive phase output signal CMP9outP and the inversion phase output signal CMP9outN. At this time, the inversion phase output signal CMP9outN is outputted from the node N13, and the positive phase output signal CMP9outP is outputted from the node N14, as shown in FIG. 7B. Similarly, the differential amplifying circuit CMP10 amplifies the inputted differential input signal Sin and outputs a differential output signal CMP10out composed of the positive phase output signal CMP10outP and the inversion phase output signal CMP10outN. That is, the inversion phase output signal CMP10outN is outputted from the node N15, and the positive phase output signal CMP10outP is outputted from the node N16, as shown in FIG. 7C. At this time, the common mode voltage shift value Voff2 generated by the resistance Rb2 and the constant current source Ib10 is applied to the differential output signal CMP10out. The amplitudes of the respective output signals are equal under the conditions of Ib9=Ib10 and R13=R14=R15=R16.

Figure 7D:
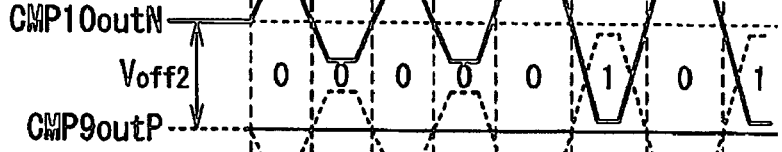
Figure 7E:
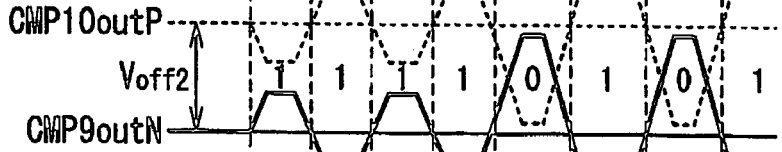
Figure 7F:
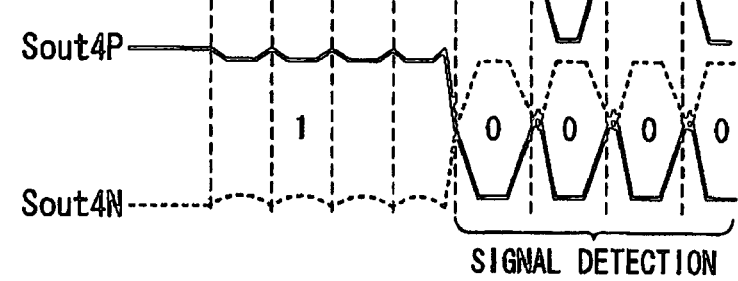

The positive phase output signal CMP9outP and the inversion phase output signal CMP10outN to which the offset voltage Voff2 is applied is supplied to the exclusive-OR EOR4. The inversion phase output signal CMP9outN and the positive phase output signal CMP10outP to which the offset voltage Voff2 is applied is supplied to the exclusive-OR EOR4. As shown in FIG. 7D, the exclusive-OR EOR4 compares the positive phase output signal CMP9outP and the inversion phase output signal CMP10outN and the inversion phase output signal CMP9outN and the positive phase output signal CMP10outP. As shown in FIG. 7D, when the positive phase output signal CMP9outP is lower than the inversion phase output signal CMP10outN, the signals CMP10outN and CMP9outP indicates "0", and when the positive phase output signal CMP9outP is equal to or higher than the inversion phase output signal CMP10outN, the signals CMP10outN and CMP9outP indicates "1". Similarly, as shown in FIG. 7E, when the positive phase output signal CMP10outP is lower than the inversion phase output signal CMP9outN, the signals CMP10outP and CMP9outN indicates "0", and when the positive phase output signal CMP10outP is equal to or higher than the inversion phase output signal CMP9outN, the signals CMP10outP and CMP9outN indicates "1".

The resistance Rb2 of a common mode voltage adjusting circuit is determined based on the amplitude of a signal to be detected. If the amplitudes of the positive phase input signal SinP and the inversion phase input signal SinN are lower than that of the signal to be detected, the resistance Rb2 to apply the common mode voltage shift value Voff2 is determined so as to always output the inversion phase output signal CMP10outN higher than the positive phase output signal CMP9outP (the positive phase output signal CMP10outP equal to higher than the inversion phase output signal CMP9outN). In addition, the resistance Rb2 is determined as follows. That is, when the amplitudes of the positive phase input signal SinP and inversion phase input signal SinN are higher than that of the signal to be detected, the positive phase output signal CMP9outP higher than the inversion phase output signal CMP10outN is outputted, if the positive phase input signal SinP is higher than the inversion phase input signal SinN, and the inversion phase output signal CMP9outN higher than the positive phase output signal CMP10outP is outputted if the positive phase input signal SinP is lower than the inversion phase input signal SinN.

A case will be described where the amplitude of the differential input signal Sin is smaller than that of the signal to be detected by the signal detecting circuit according to the present invention. When the positive phase input signal SinP and inversion phase input signal SinN whose amplitudes are smaller than that of the signal to be detected are supplied to the signal detecting circuit, the inversion phase output signal CMP10outN becomes higher than the positive phase output signal CMP9outP, these signals indicate "0", as shown in FIG. 7D. Also, the inversion phase output signal CMP10outN becomes lower than the positive phase output signal CMP9outP, these signals indicate "1", as shown in FIG. 7E. In this way, the differential exclusive-OR circuit EOR4 outputs the binary signal SoutP of the logical value "1" as the exclusive-OR result. Also, the differential exclusive-OR circuit EOR4 outputs the binary signal SoutN of the logical value "0" as the exclusive-OR result.

A case will be described where the amplitude of the differential input signal Sin is larger than that of the signal desired to be detected by the signal detecting circuit. When the positive phase input signal SinP is higher than the inversion phase input signal SinN, if the positive phase output signal CMP9outP becomes higher than the inversion phase output signal CMP10outN, these signals indicates "1", as shown in FIG. 7D. If the positive phase output signal CMP10outP is higher than the inversion phase output signal CMP9outN, these signals indicate "1", as shown in FIG. 7E. When the positive phase input signal SinP is lower than the inversion phase input signal SinN, if the positive phase output signal CMP9outP is lower than the inversion phase output signal CMP10outN, these signals indicate "0", as shown in FIG. 7D. If the positive phase output signal CMP10outP becomes lower than the-inversion phase output signal CMP9outN, these signals indicate "0", as shown in FIG. 7E. In this way, the differential exclusive-OR circuit EOR4 outputs the binary signal SoutP of "0" as the exclusive-OR result, if the positive phase input signal SinP is higher than the inversion phase input signal SinN, and outputs the binary signal SoutP of "0" as the exclusive-OR result, if the positive phase input signal SinP is lower than the inversion phase input signal SinN.

As mentioned above, if the differential input signal Sin has the amplitude equal to or higher than the shift value Voff2 set by the resistance Rb, the binary signal Sout3P becomes "0", and the differential input signal Sin can be detected.

In the signal detecting circuit according to the present invention, its circuit configuration can be simplified by shifting the common mode voltage to only one of the two differential amplifying circuits and changing the combination of the inputs of the differential exclusive-OR circuit. Thus, it is possible to attain the signal detecting circuit having the high precision and high speed, in which the influence of the manufacturing dispersions is small.

As mentioned above, although the embodiments of the present invention have been described in detail, the specific configurations are not limited to the foregoing embodiments. Even if the modification in the range without departing the scope and spirit of the present invention is executed, it is included in the present invention. For example, in FIG. 4, by removing the resistance Rb1 and connecting the resistances R11 and R12 directly to the power supply line and then installing the constant current sources equal to each other between the node N11 and the grounded potential and between the node N12 and the grounded potential, the common mode voltage can be controlled.

According to the signal detecting circuit of the present invention, it is possible to correspond to the higher speed signal and detect the differential signal at the high precision.

Also, it is possible to reduce the manufacturing cost of the signal detecting circuit for detecting the differential signal.

What is claimed is:

1. A signal detecting circuit comprising:
a first differential amplifier configured to amplify a differential input signal and to output first positive and inversion phase output signals;
a second differential amplifier configured to amplify said differential input signal and to output second positive and inversion phase output signals, a common mode voltage of said second positive and inversion phase output signals being shifted by a predetermined value with respect to that of said first positive and inversion phase output signals; and
a differential exclusive-OR circuit configured to output an exclusive logical summation of a first pair of differential signals of said first positive phase output signal and said second inversion phase output signal and a second pair of differential signals of said second positive phase output signal and said first inversion phase output signal, as a positive phase exclusive-OR output signal.

2. The signal detecting circuit according to claim 1, wherein said differential exclusive-OR circuit outputs an inversion phase exclusive-OR output signal with an inverted phase of said positive phase exclusive-OR output signal, in addition to said positive phase exclusive-OR output signal.

3. The signal detecting circuit according to claim 1, wherein said common mode voltage is shifted to down a level of said second positive and inversion phase output signals lower than that of said first positive and inversion phase output signals.

4. The signal detecting circuit according to claim 3, wherein said first differential amplifier comprises:
   a differential pair first and second transistors;
   a first resistance element connected between a power supply line and said first transistor;
   a second resistance element connected between the power supply line and said second transistor; and
   a first constant current source connected with said first and second transistors and a ground potential, and
   said second differential amplifier comprises:
   a differential pair third and fourth transistors;
   a third resistance element connected with said third transistor;
   a fourth resistance element connected with said fourth transistor;
   a fifth resistance element connected between the power supply line and said third and fourth resistances elements; and
   a second constant current source connected with said third and fourth transistors and the ground potential, and
   wherein said common mode voltage is shifted by said fifth resistance element and said second constant current source.

5. The signal detecting circuit according to claim 4, wherein said first to fourth transistors are N-channel MOS transistors.

6. The signal detecting circuit according to claim 4, wherein values of said first to fourth resistances elements are equal to each other and current values of said first and second constant current sources are equal to each other.

7. The signal detecting circuit according to claim 1, wherein said common mode voltage is shifted to raise a level of said second positive and inversion phase output signals higher than that of said first positive and inversion phase output signals.

8. The signal detecting circuit according to claim 7, wherein said first differential amplifier comprises:
   a differential pair first and second transistors;
   a first resistance element connected between a ground potential and said first transistor;
   a second resistance element connected between the ground potential and said second transistor; and
   a first constant current source connected with said first and second transistors and a power supply line, and
   said second differential amplifier comprises:
   a differential pair third and fourth transistors;
   a third resistance element connected with said third transistor;
   a fourth resistance element connected with said fourth transistor;
   a fifth resistance element connected between the ground potential and said third and fourth resistances elements; and
   a second constant current source connected with said third and fourth transistors and the power supply line, and
   wherein said common mode voltage is shifted by said fifth resistance elements and said second constant current source.

9. The signal detecting circuit according to claim 8, wherein said first to fourth transistors are P-channel MOS transistors.

10. The signal detecting circuit according to claim 8, wherein values of said first to fourth resistances elements are equal to each other and current values of said first and second constant current source are equal to each other.

11. The signal detecting circuit according to claim 1, wherein said common mode voltage is shifted such that a predetermined binary logical value is outputted as said positive phase exclusive-OR output signal when an amplitude of said differential input signal is smaller than said predetermined value and such that a binary logical value different from the predetermined binary logical value is outputted as said positive phase exclusive-OR output signal when the amplitude of said differential input signal is larger than said predetermined value.

12. A signal detecting circuit comprising:
   a first differential amplifier configured to amplify a differential input signal and to output first positive and inversion phase output signals;
   a second differential amplifier configured to amplify said differential input signal and to output second positive and inversion phase output signals, a common mode voltage of said second positive and inversion phase output signals being shifted by a predetermined value with respect to that of said first positive and inversion phase output signals; and
   a differential exclusive-OR circuit configured to output a predetermined binary logical value as a positive phase exclusive-OR output signal when an amplitude of said differential input signal is smaller than said predetermined value and a binary logical value different from the predetermined binary logical value as said positive phase exclusive-OR output signal when the amplitude of said differential input signal is larger than said predetermined value.

13. The signal detecting circuit according to claim 12, wherein said differential exclusive-OR circuit outputs an inversion phase exclusive-OR output signal with an inverted phase of said positive phase exclusive-OR output signal, in addition to said positive phase exclusive-OR output signal.

14. The signal detecting circuit according to claim 12, wherein said differential exclusive-OR circuit output an exclusive logical summation of a first pair of differential signals of said first positive phase output signal and said second inversion phase output signal and a second differential signals of said second positive phase output signal and said first inversion phase output signal, as a positive phase exclusive-OR output signal.

15. The signal detecting circuit according to claim 12, wherein said common mode voltage is shifted to down a level of said second positive and inversion phase output signals lower than that of said first positive and inversion phase output signals.

16. The signal detecting circuit according to claim 12, wherein said common mode voltage is shifted to raise a level of said second positive and inversion phase output signals higher than that of said first positive and inversion phase output signals.

* * * * *